(12) United States Patent
Tokuda et al.

(10) Patent No.: US 9,184,416 B2
(45) Date of Patent: Nov. 10, 2015

(54) ORGANIC ELECTRO LUMINESCENT DISPLAY DEVICE

(71) Applicant: Japan Display Inc., Tokyo (JP)

(72) Inventors: Naoki Tokuda, Tokyo (JP); Mitsuhide Miyamoto, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/458,304

(22) Filed: Aug. 13, 2014

(65) Prior Publication Data

US 2015/0048347 A1   Feb. 19, 2015

(30) Foreign Application Priority Data

Aug. 15, 2013   (JP) ................. 2013-168995

(51) Int. Cl.
| | |
|---|---|
| *H01L 29/205* | (2006.01) |
| *H01L 29/08* | (2006.01) |
| *H01L 35/24* | (2006.01) |
| *H01L 51/00* | (2006.01) |
| *H01L 33/00* | (2010.01) |
| *H01L 51/52* | (2006.01) |
| H01L 27/32 | (2006.01) |

(52) U.S. Cl.
CPC ........... *H01L 51/5284* (2013.01); *H01L 27/322* (2013.01); *H01L 27/3213* (2013.01); *H01L 27/3218* (2013.01); *H01L 27/3246* (2013.01)

(58) Field of Classification Search
None
See application file for complete search history.

(56) References Cited

U.S. PATENT DOCUMENTS

| | | | |
|---|---|---|---|
| 6,744,198 B2 * | 6/2004 | Hirabayashi | 313/506 |
| 2002/0125820 A1 | 9/2002 | Sheu et al. | |
| 2008/0061394 A1 * | 3/2008 | Nakagawa | 257/435 |
| 2011/0095312 A1 * | 4/2011 | Murakami et al. | 257/89 |

FOREIGN PATENT DOCUMENTS

| | | |
|---|---|---|
| JP | 2002-216960 A | 8/2002 |
| JP | 2008-91069 A | 4/2008 |

* cited by examiner

*Primary Examiner* — Calvin Choi
(74) *Attorney, Agent, or Firm* — Lowe Hauptman & Ham, LLP

(57) ABSTRACT

An organic EL display device includes plural pixels that is arranged on a substrate in a matrix, a light shielding film that shields boundaries of the plurality of pixels, and a light emitting area in which an organic layer that is arranged between a lower electrode and an upper electrode, and formed of a plurality of layers including a light emitting layer that emits a light comes in contact with the lower electrode, in each of the plurality of pixels, in which the light shielding film has wide portions and narrow portions which are arranged along sides of the pixels, and different in width from each other.

6 Claims, 7 Drawing Sheets

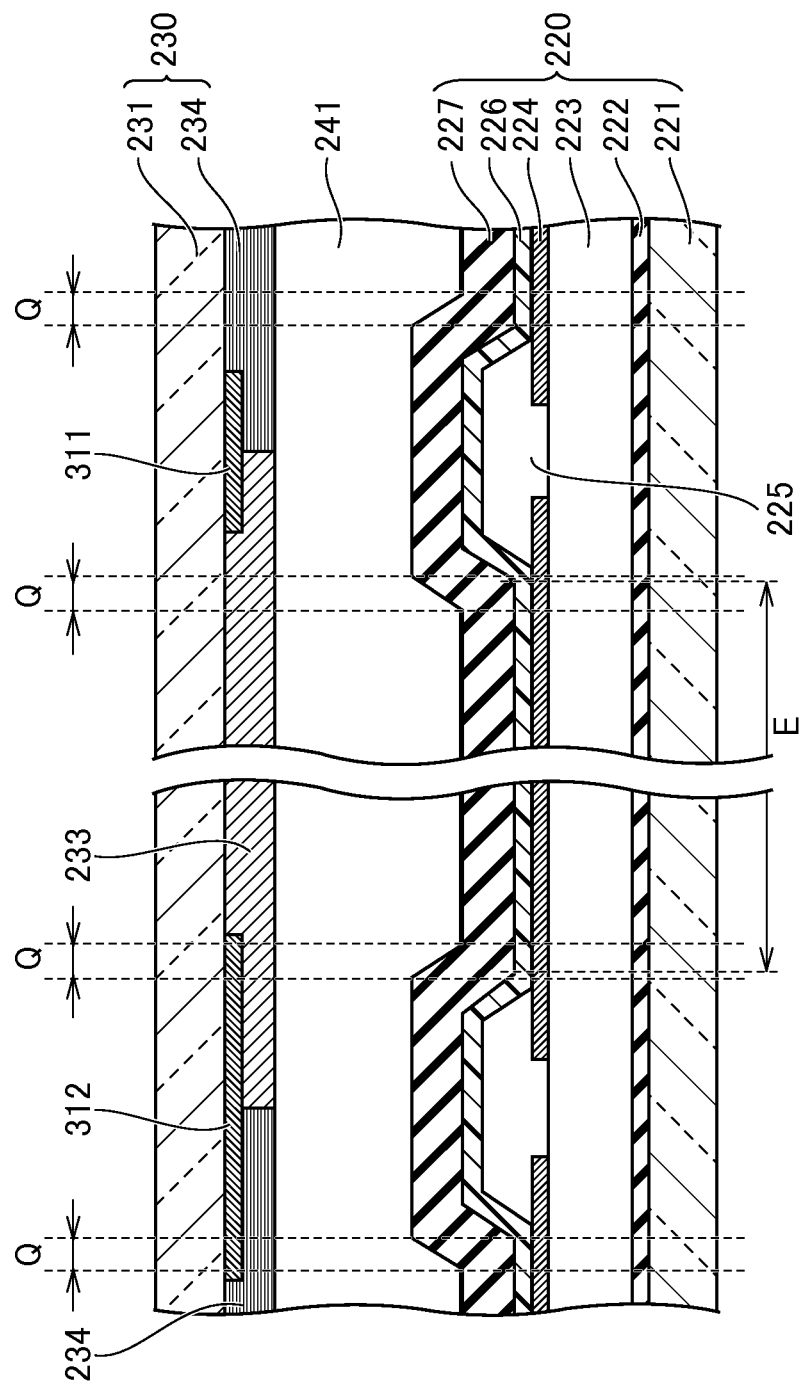

ORGANIC ELECTRO LUMINESCENT DISPLAY DEVICE

CROSS-REFERENCE TO RELATED APPLICATION

The present application claims priority from Japanese application JP2013-168995 filed on Aug. 15, 2013, the content of which is hereby incorporated by reference into this application.

BACKGROUND OF THE INVENTION

1. Field of the Invention

The present invention relates to an organic EL (electroluminescent) display device.

2. Description of the Related Art

In recent years, an image display device (hereinafter referred to as "organic EL display device") using self-luminous bodies called "organic light emitting diodes" has been input into practical use. As compared with a conventional liquid crystal display device, the organic EL display device not only is excellent in visibility and response speed, but also requires no auxiliary lighting device such as a backlight because of the use of the self-luminous bodies. Therefore, the organic EL display device can be further thinned.

As a method of conducting color display in the organic EL display device of this type, there are a method in which a light emitting element emits light of three colors of R(red), G(green), and B(blue) for each of pixels, a method in which the light emitting element emits light of white, and color filters in each pixel transmit respective wavelength ranges of three colors of RGB, and a method in which those methods are combined together.

JP 2008-091069 A discloses a light emitting device having a color adjustment layer which is put on a light emitting layer, and a diffraction layer which is disposed on the color adjustment layer in view of a parallax when viewed obliquely. JP 2002-216960 A discloses an OLED element structure in a full-color organic light emitting display.

SUMMARY OF THE INVENTION

In the organic EL display device that emits light having wavelengths of plural colors with the use of a color filter substrate, an organic layer including a light emitting layer that emits the light of a single color such as W (white) can be formed on an overall surface of a display area. For that reason, an evaporation mask is not required in formation of the light emitting layer with the advantage that pixels each having a large light emitting area can be manufactured. However, because a transparent resin is held between a TFT substrate and a sealing substrate on which the color filters are formed for adhesion, the TFT substrate and the sealing substrate are distant from each other. As a result, there is a risk that a so-called color mixture that a light emitted from the light emitting layer in an oblique direction or in a horizontal direction is output through the color filter of an adjacent pixel may be generated. The present inventors have found that a diffuse reflection in a boundary of a material which has different refractive index, such as a portion of a pixel separation film (so-called bank) that covers the end of the pixel electrode and forms a boundary of the pixel, can cause the above optical color mixture.

The present invention has been made in view of the above circumstances, and therefore an object of the present invention is to provide an organic EL display device that suppresses optical color mixture while suppressing a reduction in the light emitting efficiency.

According to the present invention, there is provided an organic EL display device, including: a plurality of pixels that is arranged on a substrate in a matrix; a light shielding film that shields boundaries of the plurality of pixels; and a light emitting area in which an organic layer that is arranged between a lower electrode and an upper electrode, and formed of a plurality of layers including a light emitting layer, in each of the plurality of pixels, in which the light shielding film has wide portions and narrow portions which are arranged along sides of the pixels, and different in width from each other.

Also, in the organic EL display device according to the present invention, the light emitting area may have long sides and short sides that extend along sides of a shape of the pixel, and are different in length, in each of the plurality of pixels, the wide portions may be arranged along the sides of the pixel corresponding to the short sides, and the narrow portions may be arranged along the sides of the pixel corresponding to the long sides.

Also, in the organic EL display device according to the present invention, each of the wide portions may have a width that covers an organic layer slope area in which the organic layer and the upper electrode around the light emitting area are inclined as compared with the light emitting area in a plan view, and each of the narrow portions may have a width that does not arrive at the organic layer slope area.

Also, in the organic EL display device according to the present invention, each of the wide portions may have a width that covers a sealing film slope area in which an inorganic sealing film formed on the upper electrode to cover the plurality of pixels is inclined as compared with a center portion of the light emitting area on the inorganic sealing film when viewed from an upper surface.

Also, in the organic EL display device according to the present invention, the light shielding film may cover a contact hole that connects the lower electrode and a transistor in the plan view.

Also, in the organic EL display device according to the present invention, the side of the light emitting area of an adjacent pixel facing the short side may be short side, and the side of the light emitting area of an adjacent pixel facing the long side may be long side.

BRIEF DESCRIPTION OF THE DRAWINGS

FIG. 7 is a diagram illustrating a modification of the organic EL display device in the same viewing field as that of FIG. 4.

DETAILED DESCRIPTION OF THE INVENTION

Figure 1:
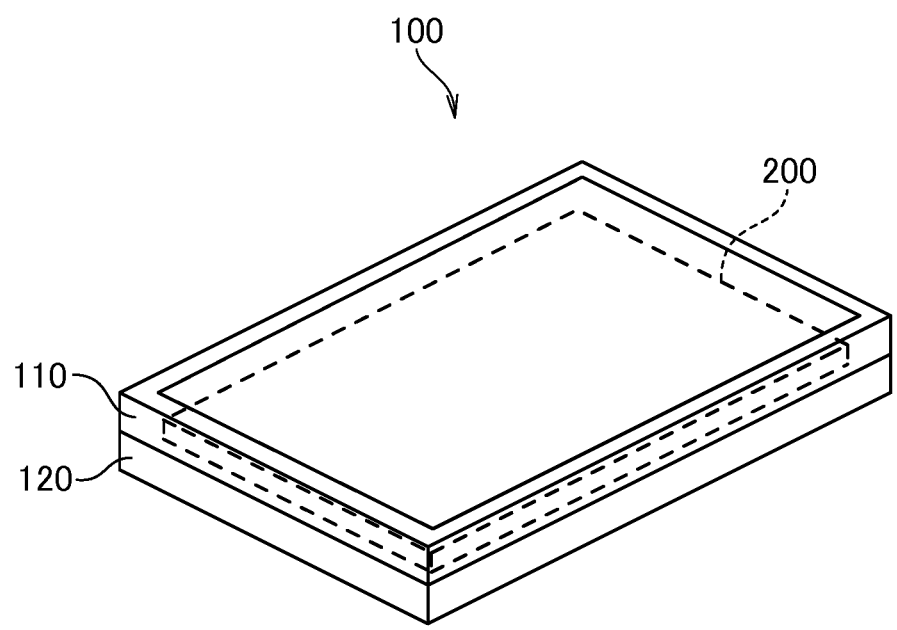
FIG. 1 is a diagram schematically illustrating an organic EL display device according to this embodiment.

Hereinafter, an embodiment of the present invention will be described with reference to the accompanying drawings.

In the drawings, the identical or equivalent elements are denoted by the same symbols, and a repetitive description will be omitted.

FIG. 1 schematically illustrates an organic EL display device 100 according to this embodiment. As illustrated in FIG. 1, the organic EL display device 100 includes an organic EL panel 200 that is fixedly held between an upper frame 110 and a lower frame 120.

Figure 2:
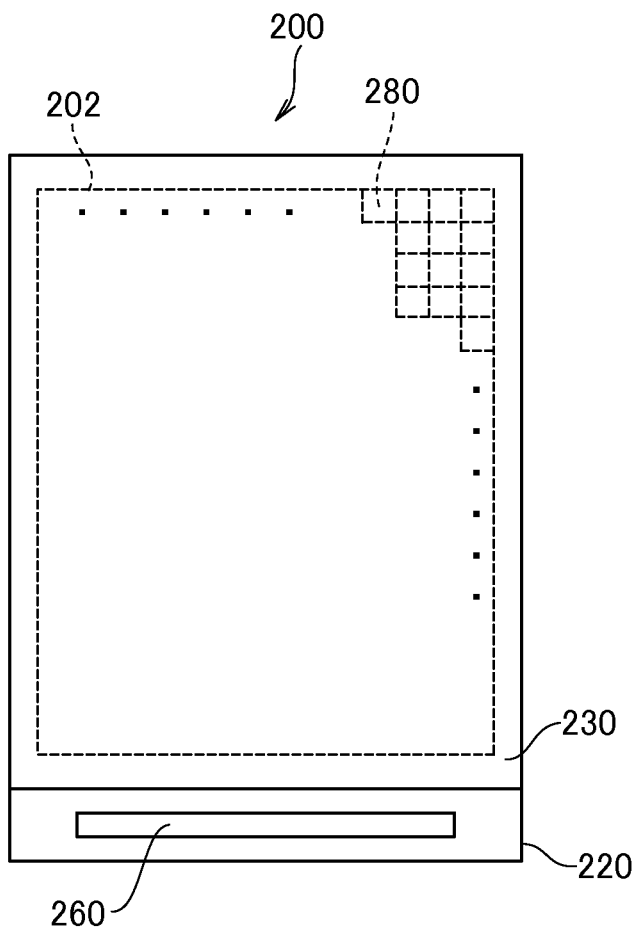
FIG. 2 is a diagram illustrating a configuration of an organic EL panel in FIG. 1.

FIG. 2 illustrates a configuration of the organic EL panel 200 in FIG. 1. The organic EL panel 200 has two substrates of a TFT (thin film transistor) substrate 220 and a sealing substrate 230, and a space between those substrates 220 and 230 is filled with a transparent resin 241 (refer to FIG. 4). The TFT substrate 220 has pixels arranged in a display area 202 in a matrix. In this example, each of the pixels is configured by the combination of sub-pixels 280 each emitting a different color. Also, a drive IC (integrated circuit) 260 which is a driver circuit that applies an electric potential for conducting between a source and a drain of a pixel transistor to a scanning signal line (not shown) of the pixel transistor arranged in each of the sub-pixels 280, and also applies a voltage corresponding to a gray scale value of a pixel to a data signal line of each pixel transistor is mounted on the TFT substrate 220. The TFT can be formed of an LTPS semiconductor, an amorphous semiconductor, an oxide semiconductor, or other semiconductors.

Also, in the organic EL panel 200 according to this embodiment, the light emitting elements of the respective sub-pixels 280 arranged in the display area 202 of the TFT substrate 220 emit white light, and allow the light to transmit through the sealing substrate 230 as four-color light of R(red), G(green), B (blue), and W (white) to conduct color display. Alternatively, the combination of three colors of RGB, or the other colors may be used, or the light emitting elements on the TFT substrate 220 may emit the light of not one white color but plural colors to conduct color display. In this case, no color filter may be used for the sealing substrate 230.

Figure 3:
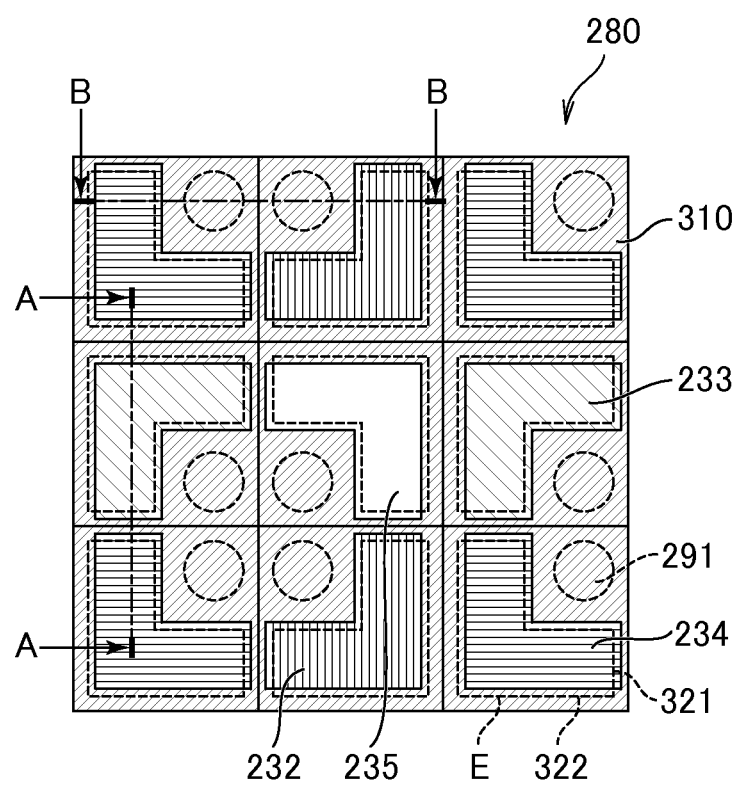
FIG. 3 is a plan view illustrating an arrangement of a black matrix on a sealing substrate, and an arrangement of light emitting areas and contact holes on a TFT substrate in comparison for nine sub-pixels in a display area of FIG. 2.

FIG. 3 is a plan view illustrating an arrangement of black matrixes 310 on the sealing substrate 230, and an arrangement of light emitting areas E and contact holes 291 on the TFT substrate 220 in comparison for the nine sub-pixels 280 in the display area 202 of FIG. 2. In this example, each of the black matrixes 310 is a light shielding film for preventing the transmission of the light from the adjacent sub-pixels 280 between the respective sub-pixels 280 on which the color filters are arranged, and formed between adjacent light transmission areas. As illustrated in FIG. 3, each of the pixels includes the four sub-pixels 280 having an R sub-pixel having an R area 232 in which a color filter of R is formed, a G sub-pixel having a G area 233 in which a color filter of G is formed, a B sub-pixel having a B area 234 in which a color filter of B is formed, and a W sub-pixel having a W area 235 having no color filter. The combination of those four sub-pixels 280 functions as one pixel.

In each of the sub-pixels 280 in FIG. 3, the arrangement of light emitting areas E that emits the white light on the TFT substrate 220, and the arrangement of the contact holes 291 for connecting lower electrodes 224 which will be described later to an electrode 228 (refer to FIG. 4) of a source or a drain of the transistor are shown. In this way, in this embodiment, the respective light emitting areas E are L-shaped with the avoidance of the contact holes 291. Also, the respective RGBW areas 232 to 235 are formed along the L-shaped light emitting areas E. However, those areas 232 to 235 do not completely match the L-shaped light emitting areas E. The L-shaped light emitting areas E each include a long side 322 formed to be longer along a side of the pixel, and a short side 321 formed to be shorter than the long side 322 in a portion close to adjacent pixels which is easily affected by the emitted light in the adjacent pixels. In this embodiment, each of the black matrixes 310 is formed to cover the long side 322 of the light emitting area E, and formed to expose the short side 321 of the light emitting area E. Also, the black matrix 310 is formed to cover the contact hole 291.

Figure 4:
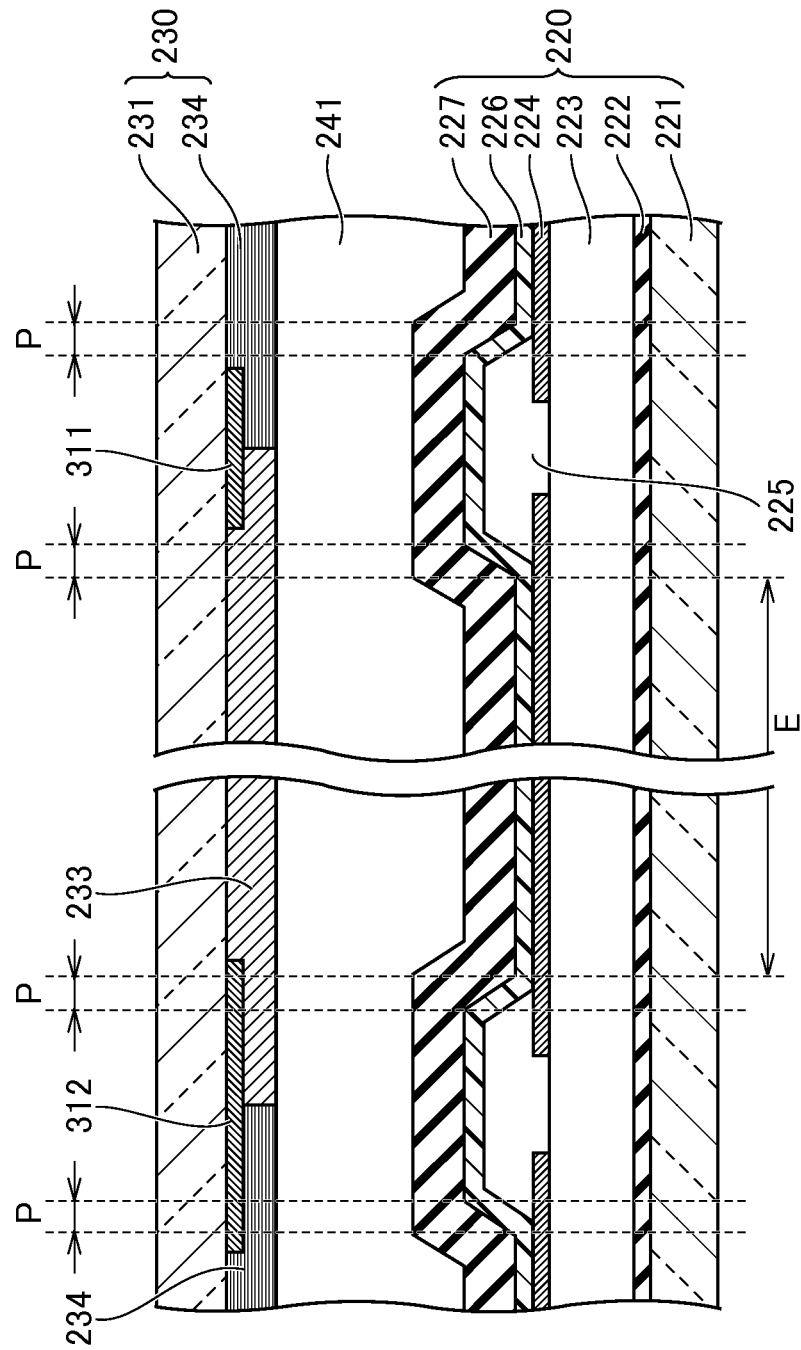
FIG. 4 is a cross-sectional view taken along a line A-A in FIG. 3.

FIG. 4 is a cross-sectional view taken along a line A-A in FIG. 3. As illustrated in FIG. 4, the TFT substrate 220 includes a transparent insulating substrate 221 made of a glass substrate, an interlayer insulating film 222 that isolates wirings used for control of the transistor, and a planarization film 223 made of an organic insulating material. The TFT substrate 220 also includes the lower electrodes 224 that are each electrically connected to one electrode of the transistor, and formed on the planarization film 223, and pixel separation films 225 that each cover ends of the lower electrodes 224, and isolate between the adjacent sub-pixels. The TFT substrate 220 further includes an organic layer/upper electrode layer 226 that is formed on the lower electrodes 224 and the pixel separation films 225 so as to cover the overall display area 202, and formed of an organic layer including the light emitting layer that emits the white light, and an upper electrode formed of a transparent electrode formed on the organic layer, and an inorganic sealing insulating film 227 formed to cover the organic layer/upper electrode layer 226.

Also, FIG. 4 illustrates, as a part of the configuration of the sealing substrate 230, a transparent insulating substrate 231 such as a glass substrate, a narrow portion 311 formed with a narrower width and a wide portion 312 formed with a wider width in the black matrix 310 that shields the light leaked from between the respective sub-pixels, and a G area 233 and B areas 234 which are color filters. The TFT substrate 220 and the sealing substrate 230 adhere to each other with the transparent resin 241. In this example, the light emitting areas E are areas in which the lower electrodes 224 come in contact with the organic layer/upper electrode layer 226. The wide portion 312 of the black matrix 310 covers organic layer slope areas P where the pixel separation films 225 around the light emitting areas E are formed in which the organic layer/upper electrode layer 226 is inclined as compared with the light emitting areas E, and the narrow portion 311 of the black matrix 310 does not cover the organic layer slope areas P. That is, the black matrix 310 corresponding to the long side 322 of the light emitting areas E is formed in the wide portion 312 that covers the organic layer slope areas P, and the black matrix 310 corresponding to the short side 321 of the light emitting areas E is formed in the narrow portion 311 that does not cover the organic layer slope areas P.

Figure 5:
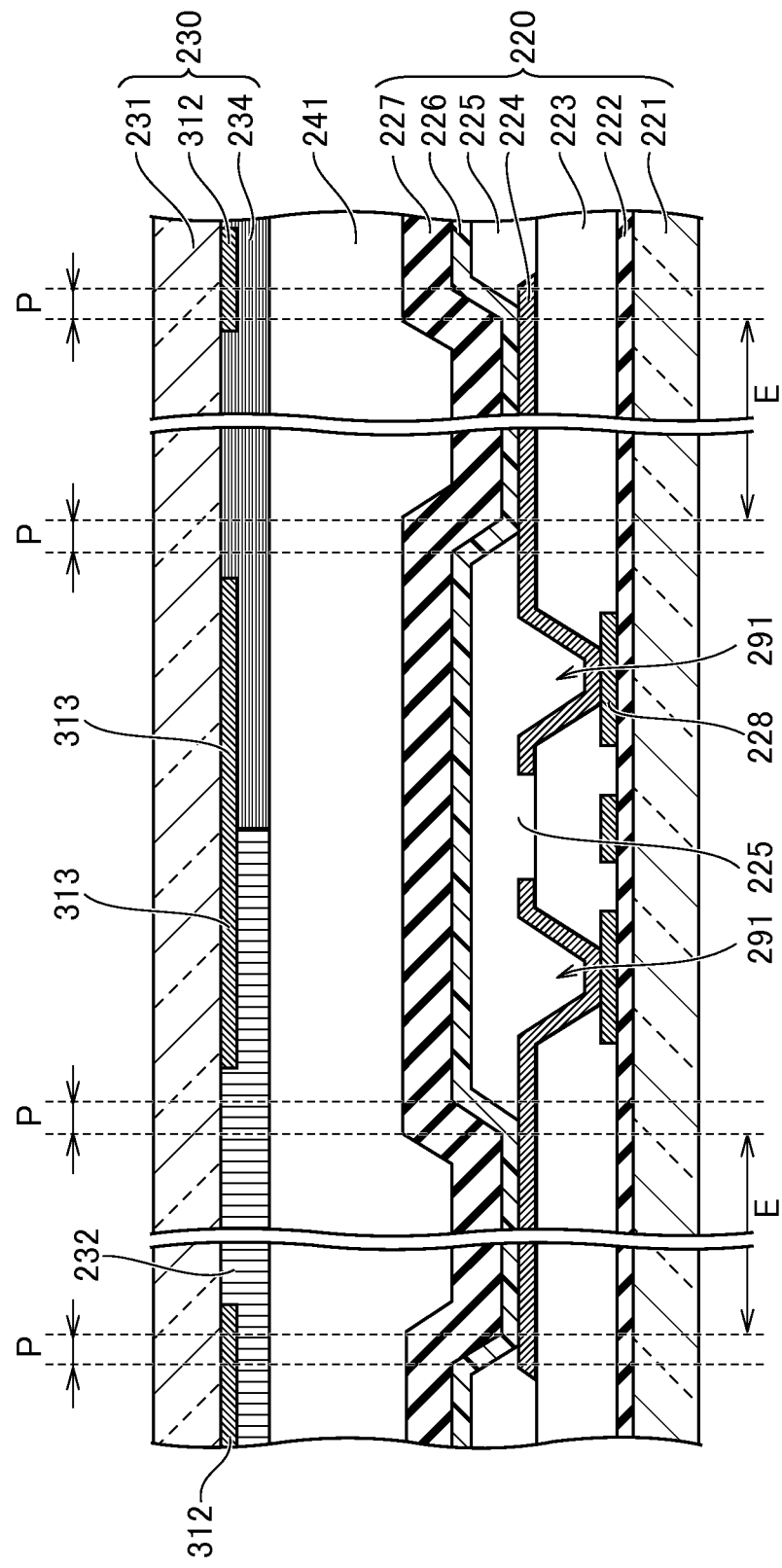
FIG. 5 is a cross-sectional view taken along a line B-B in FIG. 3.

FIG. 5 is a cross-sectional view taken along a line B-B in FIG. 3. This cross-section traverses the sub-pixels having the R area 232, and the sub-pixels having the B area 234. Unlike the cross-section taken along a line A-A in FIG. 4, the cross-section taken along the line B-B traverses the contact holes 291. As illustrated in FIG. 5, the black matrix 310 has a contact hole shield portion 313 of the black matrix 310 formed to cover each contact hole 291. In this example, because the contact hole shield portion 313 is distant from the adjacent pixel at an end thereof, the contact hole shield portion 313 is so formed as not to cover the organic layer slope areas P, and the light emission efficiency is enhanced.

Figure 6:
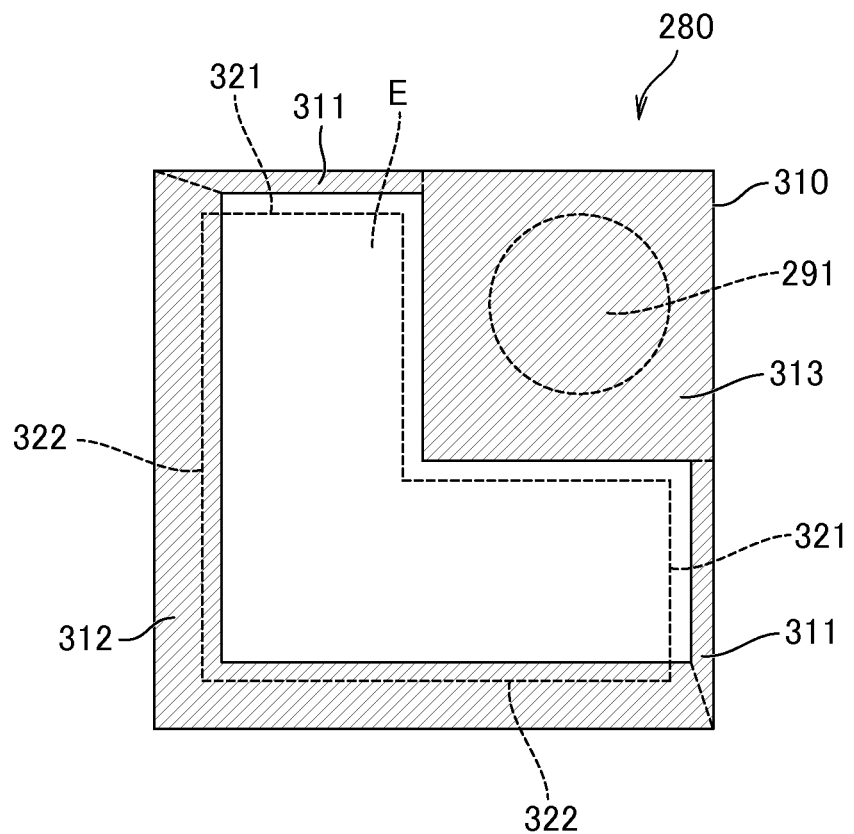
FIG. 6 is a plan view illustrating a black matrix of one sub-pixel.

FIG. 6 is a plan view illustrating the black matrix 310 of one sub-pixel 280. As illustrated in FIG. 6, the light emitting area E has the long sides 322 longer in length which extend along sides of a shape of the sub-pixel 280, and the short sides 321 shorter in length which extend along other sides of the shape of the sub-pixel 280. Also, the black matrix 310 corresponding to the sides of the sub-pixels 280 along the long sides 322 forms the wide portions 312 that cover the organic layer slope areas P, and the black matrix 310 corresponding to the sides of the sub-pixels 280 along the short sides 321 forms the narrow portions 311 that do not cover the organic layer slope areas P. The contact hole shield portion 313 is so formed as to cover the overall contact hole 291, and also so formed as not to cover the organic layer slope area P at the light emitting area E side.

As has been described above, according to this embodiment, because the wide portions 312 shield the organic layer slope areas P of the long sides 322 of the light emission area in which a large amount of diffuse reflection is generated, the optical color mixture can be suppressed. Also, the narrow portions 311 formed not to cover the organic layer slope areas P of the short sides 321 of the light emitting area E can suppress the deterioration of the light emission efficiency even if the wide portions 312 shield the organic layer slope areas P. Also, because the contact hole shield portion 313 covers the overall contact hole 291, the optical color mixture caused by the diffuse reflection generated on the slope of the contact hole 291 can be suppressed. On the other hand, because the contact hole shield portion 313 does not cover the organic layer slope areas P on the sides facing the light emitting area E, the deterioration of the light emission efficiency is suppressed. Therefore, according the organic EL display device of this embodiment, the optical color mixture can be suppressed while suppressing the deterioration of the light emission efficiency.

FIG. 7 illustrates a modification of the above-mentioned organic EL display device in the same viewing field as that of FIG. 4. A difference from the configuration illustrated in FIG. 4 resides in that the wide portion 312 covers sealing film slope areas Q which are slope portions of the inorganic sealing insulating film 227, and the narrow portion 311 does not cover the sealing film slope areas Q. The sealing film slope areas Q are areas formed in the vicinity of edges of the light emitting area E, which are inclined as compared with a center portion of the light emitting area E. It is conceivable that the diffuse reflection is generated in not only the organic layer slope areas P, but also the sealing film slope areas Q. Therefore, the wide portion 312 is configured to cover the sealing film slope areas Q formed on the light emitting areas E side of the organic layer slope areas P, as a result of which the optical color mixture can be further suppressed. Also, even in this configuration, the same effects as those described in the above-mentioned embodiment can be obtained.

In the above-mentioned embodiment, the light emitting areas E are L-shaped, but not limited to this shape, and the black matrix has only to have the wide portion and the narrow portion. Further, when the light emitting areas E each have the short sides and the long sides along the sides of the pixel, the black matrix corresponding to the short sides can be configured by the narrow portions, and the black matrix corresponding to the long sides can be configured by the wide portions.

While there have been described what are at present considered to be certain embodiments of the invention, it will be understood that various modifications may be made thereto, and it is intended that the appended claim cover all such modifications as fall within the true spirit and scope of the invention.

What is claimed is:
1. An organic EL display device, comprising:
a plurality of pixels that is arranged on a substrate in a matrix;
a light shielding film that shields boundaries of the plurality of pixels; and
light emitting areas each of which is provided in each of the plurality of pixels and is an area where an organic layer makes contact with a lower electrode, the organic layer arranged between the lower electrode and an upper electrode, and formed of a plurality of layers including a light emitting layer,
wherein each of the light emitting areas has a long side that extends along a side of a corresponding one of the plurality of pixels and a short side that extends along another side of the corresponding one of the plurality of pixels, the long side and the short side being different in length,
wherein each of the light emitting areas is adjacent to another first one of the light emitting areas and another second one of the light emitting areas,
wherein the short side of each of the light emitting areas lies next to the short side of the first one of the light emitting areas,
wherein the long side of each of the light emitting areas lies next to the long side of the second one of the light emitting areas,
wherein the light shielding film has a wide portion and a narrow portion which are different in width from each other,
wherein the narrow portion is arranged along the short side so as to expose the short side, between each of the light emitting areas and the first one of the light emitting areas, and
wherein the wide portion is arranged along the long side so as to cover the long side, between each of the light emitting areas and the second one of the light emitting areas.

2. The organic EL display device according to claim 1, wherein the wide portion has a width wide enough to cover an organic layer slope area in which the organic layer and the upper electrode around each of the light emitting areas are inclined compared with the organic layer and the upper electrode in each of the light emitting areas in a plan view, and
wherein the narrow portion has a width not wide enough to extend to the organic layer slope area.

3. The organic EL display device according to claim 1, wherein the wide portion has a width wide enough to cover a sealing film slope area in which an inorganic sealing film formed on the upper electrode to cover the plurality of pixels is inclined as compared with the inorganic sealing film at a center portion of each of the light emitting areas when viewed from an upper surface.

4. The organic EL display device according to claim 1, wherein the light shielding film covers a contact hole that connects the lower electrode and a transistor in the plan view.

5. The organic EL display device according to claim 1, wherein the pixels are formed on a first substrate, and the light shielding film is formed on a second substrate.

6. The organic EL display device according to claim 1, wherein the pixels are formed on a first substrate, and the light shielding film is formed on a second substrate, and
wherein each of the light emitting areas emits a white light, and the second substrate includes a color filter.

* * * * *